Dec. 8, 1970 C. E. DIXON 3,546,607

NOISE IMMUNE MUTING CIRCUIT FOR PULSE COUNTING DETECTORS

Filed Dec. 8, 1967 2 Sheets-Sheet 1

PRIOR ART

INVENTOR.
CHARLES E. DIXON

BY Richard W Anderson

AGENT

INVENTOR.
CHARLES E. DIXON
BY Richard W. Anderson
AGENT

United States Patent Office 3,546,607
Patented Dec. 8, 1970

3,546,607
NOISE IMMUNE MUTING CIRCUIT FOR PULSE COUNTING DETECTORS

Charles E. Dixon, Richardson, Tex., assignor to Collins Radio Company, Cedar Rapids, Iowa, a corporation of Iowa Filed Dec. 8, 1967, Ser. No. 689,022
Int. Cl. H03d 3/04
U.S. Cl. 329—126 7 Claims

ABSTRACT OF THE DISCLOSURE

Frequency modulation detectors employing pulse counting detection techniques develop a DC reference output in the presence of unmodulated carrier signal. In systems employing carrier cut-off between modulation sequences, this type of detection causes audio noise perturbation. A gating arrangement may automatically supply a constant area pulse train generated from a reference carrier signal to the detection integrating means under the control of a carrier presence sensing circuit which monitors the input signal. In the absence of carrier input, a carrier reference pulse train is applied to the integrator to eliminate the DC transient normally generated by the integrator as the input FM signal carrier is turned on and off.

This invention relates generally to frequency modulation detecting circuitry and more particularly to an improved FM detector of the type employing pulse counting techniques.

The pulse counting detector is a known expedient in the art wherein a train of constant area pulses is generated at a repetition rate defined by the frequency of the FM input signal. In the absence of FM modulation of the carrier input signal, the pulse counting detector generates a reference train of constant area pulses which, by integration, produces a DC output signal of reference magnitude. When the carrier input signal is frequency modulated, the DC component of the integrator output is varied in magnitude about the reference DC level as a function of the difference in pulse repetition frequency of the constant area pulse generator. Thus, the output from the integrator constitutes a recovery of the FM modulation intelligence. The pulse counting FM detector is employed where extremely linear FM detection is desired or necessitated. While the pulse counting detector provides a degree of linearity not obtainable by the Foster-Seeley discriminator, it may introduce DC switching transients in the recovered audio in applications where the carrier may be switched on and off. For example, in FM stereo broadcasting, particularly when store-casting is included on a subcarrier channel of the stereo transmission, it is ofttimes desirable to turn off the store-casting subcarrier when intelligence is not being transmitted; as for example, between the playing of recordings. By turning off the carrier during these intervals, cross talk, noise, etc., is not transmitted. However, should the demodulating equipment include a pulse counting FM detector, the carrier turn off generates a large DC switching transient at the detector output which can cause serious noise perturbations in the audio reproductions. This switching transient is inherent in pulse counting detectors since the output of this type of detector is a discrete DC level in the absence of modulation. The received carrier signal as opposed to the conventional Foster-Seeley discriminator where the output is zero either in the absence of modulation on the input carrier or in the absence of the carrier per se.

The object of the present invention is accordingly the provision for an FM detection system employing the pulse counting technique wherein, in the absence of an input carrier signal, a reference carirer pulse train is automatically applied to the integrator of the pulse counting detector to maintain the detector output at substantially the same DC level as that experienced in the normal presence of an unmodulated received carrier input.

A further object of the present invention is the provision of a noise immune muting circuitry in a pulse counting detector to permit the carrier input to be removed slowly from the detector-integrator with a slow transition through the noise threshold region.

The present invention is featured in the addition of a CW reference signal pulse generating source, a carrier presence sensing circuitry, and first and second gating means to a conventional FM pulse counting detector, wherein, in the absence of an input carrier signal, the sensing circuitry gates the reference CW pulse source to the detector-integrator. The integrator output, in the absence of an input carrier or in the absence of frequency modulation of a received carrier signal, then produces a substantially constant output DC level.

These and other features and objects of the present invention will become apparent upon reading the following description in conjunction with the accompanying drawings in which:

FIGS. 1*a* and 1*b* represent typical Foster-Seeley discriminator and pulse counting detector transfer characteristics, respectively;

Figure 1B:
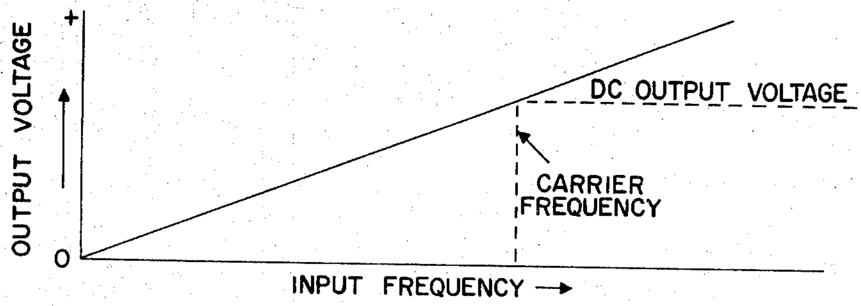
FIG 1B PRIOR ART
Figure 1A:
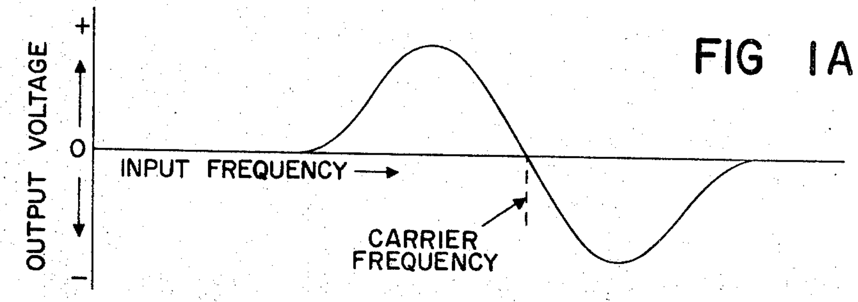

As above discussed, the pulse counting frequency modulation detector is often employed to demodulate a frequency modulated carrier signal since it has definite improved linearity characteristics as compared to the conventional Foster-Seeley circuitry. The Foster-Seeley circuitry is inherently an S-type of characteristic, producing a zero DC output in the absence of frequency modulation on the applied carrier and respective positive and negative output signals in response to the carrier frequency deviating with modulation. The typical Foster-Seeley discriminator characteristic is illustrated in FIG. 1*a*. The output from this circuit is seen to be zero at the carrier frequency.

The pulse counting detector, by contradistinction, produces a discrete DC output level corresponding to the carrier frequency, and the DC output level varies about this carrier or reference output in response to frequency modulation of the applied carrier signal. A typical pulse counting detector characteristic is shown in FIG. 1*b*. FM receivers employing pulse counting detectors are subject to transients appearing at the output when the incoming signal (the carrier) is applied or removed Reference to FIG. 1*b* readily indicates that, in the presence of a carrier signal, the pulse counting detector produces a positive DC output voltage. Should the carrier signal be removed, the DC output from the pulse counting detector falls rapidly to zero volts. Conversely, a sudden application of carrier frequency to the pulse counting detector causes the output from the detector to rise rapidly to the discrete output voltage level corresponding to the carrier frequency. Thus, while the Foster-Seeley discriminator (FIG. 1*a*) has zero DC output for both the case of signal and no-signal operation, the pulse counting detector, as the signal is applied and removed, generates an appreciable DC voltage step at the output. This DC voltage step causes serious audio noise perturbations since the magnitude of the step is usually much greater than the normal output signal level and the step will drive subsequent amplifier stages to saturation. The rather long recovery time encountered results in a very serious audio disturbance.

Figure 2:
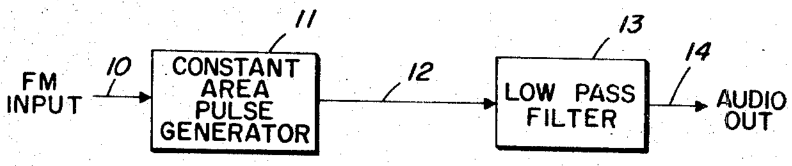
FIG. 2 is a functional diagram of a conventional pulse counting frequency modulation detector.

The present invention permits the employment of the pulse counting detector without the disadvantage of audio transient generation should the carrier be turned on or off. The pulse counting detector circuitry normally employed in the art will be considered briefly. With reference to FIG. 2, the pulse counting detector conventionally consists of a constant area pulse generator 11 to which an FM input signal 10 is applied. The output 12 from the constant area pulse generator, consisting of a train of pulses corresponding to the zero crossings of the FM input 10, is integrated in a low pass filter 13 to develop a dc output 14 which constitutes a recovery of the FM modulation component. The constant area pulse generator 11 might conventionally employ (FIG. 3) a squaring amplifier 43 the output of which is applied to a differentiating circuitry 44 with the output from the differentiator being applied to a one-shot multivibrator 45. The output 12 from the constant area pulse generator is thus a train of fixed duration pulses the repetition rate of which corresponds to the frequency of the input signal 10.

Figure 4:
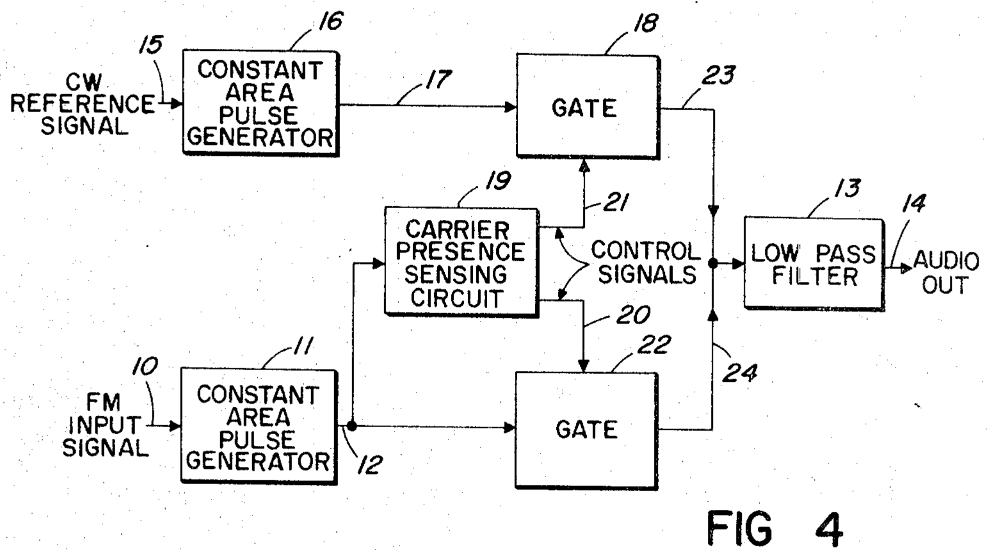
FIG. 4 is a functional diagram of an improved pulse counting frequency modulation detector in accordance with the present invention.

The improved pulse counting FM detector of the present invention is shown functionally in FIG. 4. The normal constant area pulse generator and low pass filter associated with a pulse counting detector is supplemented by a source of reference pulses at the FM carrier frequency. A carrier presence sensing circuitry is employed in conjunction with gating means to rapidly apply pulses generated at the carrier reference signal frequency to the low pass filter in the absence of an FM input signal carrier.

With reference to FIG. 4, the FM input signal 10 is applied to a constant area pulse generator 11 the output 12 of which is applied through a first gate 22 as a first input 24 to low pass filters 13.

The output 12 from constant area pulse generator 11 is additionally applied to a carrier presence sensing circuitry 19. A first output 20 from sensing circuit 19 is utilized to enable gate 22 and thus apply the output from constant area pulse generator 11 to the low pass filter 13. A second output 21 from the carrier presence sensing circuit 19 is utilized to enable a second gate 18 which receives an input 17 from a further constant area pulse generator 16 to which is applied a CW reference signal the frequency of which corresponds to the carrier of the FM input signal 10. The output 23 from gate 18 is additionally applied as input to the low pass filter 13. The circuitry of FIG. 4 basically operates as follows: When the FM input signal 10 is applied, the carrier presence sensing circuit 19 opens gate 22 and permits normal pulse counting detector operation by integrating constant area pulses from generator 11 in the low pass filter 13.

Should the FM input signal 10 be removed, the carrier presence sensing circuit 19 closes gate 22 and opens gate 18, thereby switching the low pass filter 13 from the FM input signal generating pulses to CW reference signal generated pulses.

When the above switching sequence is accomplished correctly and in a short period of time, no DC transient is generated at the output of the low pass filter 13. In accordance with the present invention, this switching is accomplished by means of the carrier presence sensing circuitry 19 which senses the absence of one pulse in the pulse train from constant area pulse generator 11 and immediately switches the CW reference signal pulse train as input to the low pass filter. The train of pulses from the two gate outputs 23 and 24 is thus missing but a single pulse. As will be further described the carrier presence sensing circuit also includes a noise immunity feature which allows the pulse train switching to be removed slowly with a slow transition through the noise threshold region without erratic gating action.

Figure 3:
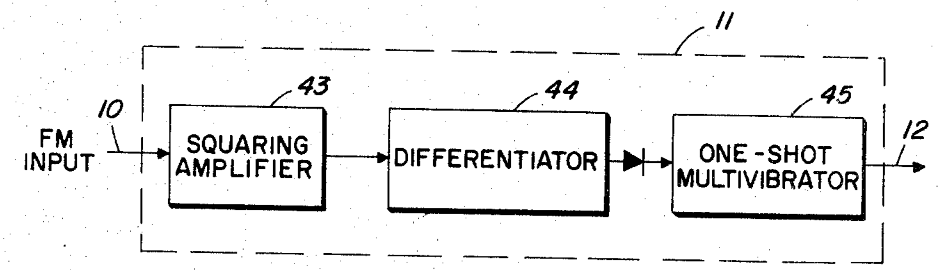
PRIOR ART FIG 3
FIG. 3 is a functional diagram of a type of constant area pulse generator conventionally employed in such circuitries.
Figure 5:
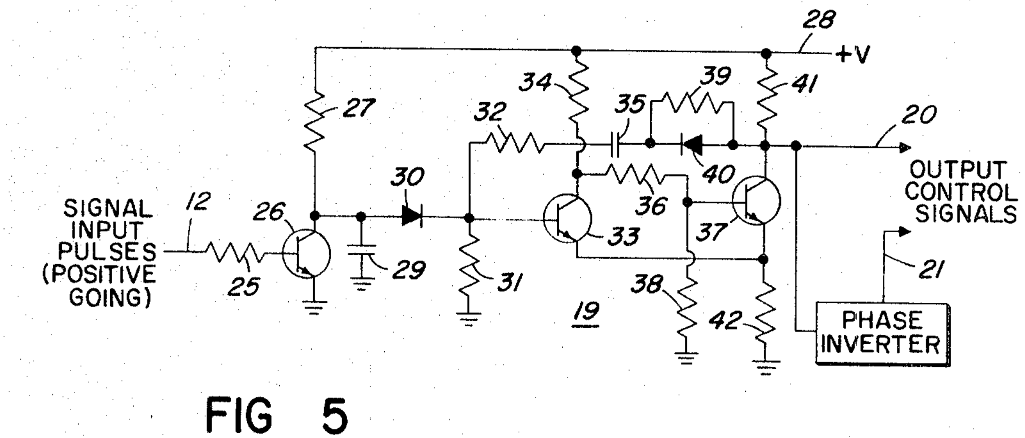
FIG. 5 is a schematic diagram of the carrier presence sensing circuitry employed in the arrangement of FIG. 4.

The carrier presence sensing circuitry is shown schematically in FIG. 5. The input pulse train 12 from the constant area pulse generator of system 11 of FIG. 3 is applied through a resistor 25 to the base of an input transistor 26. The collector of transistor 26 is connected to a supply source 28 through resistor 27, and coupled through a diode 30 to the base of a second transistor 33. Capacitor 29 is shunted across the collector-emitter terminal of transistor 26. The base of transistor 33 is grounded through a resistor 31. The collector of transistor 33 is returned to the supply source 28 through resistor 34 and coupled through a resistor 36 to the base of an output transistor 37. The base of transistor 37 is returned to ground through resistor 38 The emitters of both transistors 37 and 33 are returned to ground through a common resistor 42. The collector of the output transistor 37 is returned to the supply source 28 through a resistor 41 and coupled back to the base of transistor 33 by means of a diode 40 shunted by resistor 39 the parallel combination of which is serially connected with the capacitor 35 and resistor 32 to the base of transistor 33. A first output control signal 20 is taken from the collector of the transistor 37 while a second control signal output 21 is a phase inversion of the collector signal.

The operation of the carrier presence sensing circuit of FIG. 5 has been basically described as affecting an automatic switch-over to the source of constant area pulses from the reference CW signal source in the system of FIG. 4, in the absence of a carrier input signal, the latter being applied to the carrier presence sensing circuit as a train of pulses 12 from constant area pulse generator 11.

In the absence of input signal pulses 12 being applied transistor 26 is cut off, transistor 33 is turned on, and output transistor 37 is cut off. Capacitor 29 (collector of input transistor 26) is charged to (or is charging towards) the positive potential defined by supply source 28.

Should a train of positive pulses 12 now be applied to the sensing circuit, the first incoming pulse renders transistor 26 conductive to provide an extremely low impedance discharge path for capacitor 29. The potential change on the collector of transistor 26 causes transistors 33 and 37 to reverse their respective conductivity states such that transistor 33 is turned off and output transistor 37 is turned on.

At the conclusion of the first pulse applied to the circuit, capacitor 29 begins to charge through resistor 27 to the potential of the positive supply source 28. If the input pulse train 12 continues to be present, transistor 26 will be driven into conduction again before the potential across capacitor 29 rises to a value sufficient to cause transistors 23, and 27 to again reverse states. The voltage across capacitor 29 will thus be a saw-tooth waveform under this condition and the output transistor 37 remains in a conductive state.

Should the input pulse train 12 now be removed, capacitor 29 will continue to charge towards the potential of supply source 28 until a level is reached sufficient to cause transistors 33 and 37 to change states with transistor 33 being turned on and the output transistor 37 being turned off. At this time the sensing circuitry "takes control of itself" for a period of time determined by the time constant by resistor 32 and capacitor 35 in the feedback network between the collector of transistor 37 and the base of transistor 33; that is, the circuitry is for a period of time immune to any further change in the status of the input pulse train. This latter feature renders the circuit immune to noisy or erratic inputs and permits a gradual turn-down of the incoming signal. Transition through the threshold region is accomplished with no further output changes since the sensing circuit is in control of itself during this time interval.

The number of input pulses from input train 12 which must be missed before the previously described change of the state occurs is a function of the time constant of the resistor 27 and capacitor 29 at the input. This time constant may be set such that only one missing pulse is required to initiate the aforedescribed action. The output of the low pass filter 13 (FIG. 4) will then experience only a very minor disturbance for this missing pulse.

The outputs 20 and 21 of the constant pulse sensing circuit of FIG. 5 may be then used as control signals for application to the gates 22 and 18 of the system of FIG. 4. The outputs 20 and 21 of the constant pulse sensing circuit, being complementary in nature turn gate 22 on in the presence of an input signal 10 while turning gate 18 off to remove the reference pulse train from the low pass filter during the presence of an input signal. In the absence of an input signal the carrier presence sensing circuit 19 causes the gate control signals 20 and 21 to reverse states such that gate 22 is closed and gate 18 opened in response to the loss of a pulse from the FM input signal train, and the pulse train emanating from the CW reference signal source 15 is immediately applied to the low pass filter 13 to maintain the DC level of the output 14 at the desired reference level.

Although this invention has been described with respect to a particular embodiment thereof, it is not to be so limited, as changes and modifications may be made therein which are within the spirit and scope of the invention as defined by the appended claims.

I claim:

1. A pulse counting detector circuitry comprising a first constant area pulse generator means receiving a frequency modulated carrier input signal, a second constant area pulse generator signal receiving a carrier wave reference signal, each of said constant area pulse generators developing a train of pulses of constant duration and at a repetition rate determined by the frequency of the input signal thereto, a signal integrating means, means for selectively applying the output from said second signal generating means to said signal integrating means in response to the absence of an input signal to said first signal generating means, and an output taken from said signal integrating means comprising a direct current voltage the amplitude of which is proportional to the pulse repetition rate of the input pulse train applied thereto.

2. Circuitry as defined in claim 1 wherein said means for selective application of the output from said first and second constant area pulse generators to said signal integrating means comprises first and second signal gating means respectively receiving the outputs from said first and second constant area pulse generators, the outputs from said gating means being applied in common to the input of said signal integrating means, and a carrier presence sensing circuitry receiving the output from said first constant area pulse generating means and being responsive to the absence of a predetermined number of pulses from said first constant area pulse generator to open said second gating means and close said first gating means whereby the output from said second integrating means comprises a fixed level direct current potential corresponding to the pulse repetition rate of the pulse train from said second constant area pulse generator.

3. Circuitry as defined in claim 2 wherein the frequency of said carrier wave reference signal equals that of the carrier component of said frequency modulated input signal.

4. Circuitry as defined in claim 3 wherein said carrier presence sensing circuit comprises a capacitor a predetermined charge upon which is effective to render conductive a first transistor, a second transistor receiving the output from said first transistor and being maintained in a cut-off state when said first transistor is conductive, switching means shunting said capacitor and being responsive to input pulses from said first constant area pulse generator to discharge said capacitor, means for charging said capacitor including a resistive member and a direct current voltage source, an output control signal taken from said second transistor and applied to one of said signal gating means, means for inverting the output from said second transistor, and the output from said signal inverting means being applied as a control signal to the other one of said signal gating means.

5. A circuitry as defined in claim 4 wherein said switching means shunting said capacitor comprises a further transistor the collector-emitter junction of which shunts said capacitor, said output from said first constant area pulse generator being applied to the base of said further transistor.

6. Circuitry as defined in claim 5 further including a feedback means including a further capacitor and a resistive member connected between the output of said second transistor and the input of said first transistor, wherein the conductivity state of said first transistor is rendered immune to subsequent pulses from said first constant area pulse generator for a period of time determined by the time constant of said feedback network following the time that said second transistor switches from a conductive state to a nonconductive state.

7. In a pulse counting frequency modulation detector circuit of the type comprising a first constant area pulse generating means receiving a frequency modulation input signal and a further constant area pulse generating means receiving a carrier wave reference signal the frequency of which corresponds to the carrier component of said frequency modulated input signal, and including gating means for selectively applying the output from one or the other of said constant pulse generator as input to a signal integrating means, the output from said signal integrating means developing a direct current signal the amplitude of which corresponds to the pulse repetition rate of the train of constant area pulses applied as input thereto; means for generating a control signal for selectively gating the pulse train output from said second constant area pulse generator to the input of said signal integrating means in the absence of an input signal being applied to said first constant area pulse generator, comprising a carrier presence sensing circuit receiving the output from said first constant area pulse generator and developing an output control signal for application to said gating means in response to the absence of at least one pulse in the pulse train from said first constant area pulse generator, said carrier presence sensing circuit further comprising means maintaining said output control signal nonresponsive to further pulses from said first constant area pulse generator for a predetermined time interval subsequent to the initiation of said output control signal.

References Cited

UNITED STATES PATENTS

| | | | |
|---|---|---|---|
| 3,106,683 | 10/1963 | Creveling | 307—216X |
| 3,271,588 | 9/1966 | Mine | 307—243X |
| 3,234,373 | 2/1966 | Sellers et al. | 307—216X |
| 3,351,868 | 11/1967 | Farrow | 307—216X |
| 3,441,862 | 4/1969 | Mitchell | 307—243X |

ALFRED L. BRODY, Primary Examiner

U.S. Cl. X.R.

307—233, 243; 325—324,325, 341, 456; 328—93; 329—136; 331—49